(12) United States Patent
Van Gaal

(10) Patent No.: US 9,788,461 B2
(45) Date of Patent: Oct. 10, 2017

(54) AIRFLOW DIVIDER FOR BALANCING AIRFLOW IN A MODULAR CHASSIS SYSTEM

(71) Applicant: Adrianus Van Gaal, Ottawa (CA)

(72) Inventor: Adrianus Van Gaal, Ottawa (CA)

(73) Assignee: Ciena Corporation, Hanover, MD (US)

( * ) Notice: Subject to any disclaimer, the term of this patent is extended or adjusted under 35 U.S.C. 154(b) by 0 days.

(21) Appl. No.: 14/491,621

(22) Filed: Sep. 19, 2014

(65) Prior Publication Data

US 2016/0037676 A1 Feb. 4, 2016

Related U.S. Application Data

(60) Provisional application No. 62/030,956, filed on Jul. 30, 2014.

(51) Int. Cl.
H05K 7/20 (2006.01)
G02B 6/44 (2006.01)

(52) U.S. Cl.
CPC ....... H05K 7/20572 (2013.01); G02B 6/4452 (2013.01)

(58) Field of Classification Search
CPC ................ H05K 7/20145; H05K 7/20136
See application file for complete search history.

(56) References Cited

U.S. PATENT DOCUMENTS

| 5,237,484 | A | 8/1993 | Ferchau et al. |
| 6,459,579 | B1 | 10/2002 | Farmer et al. |
| 6,819,560 | B2 | 11/2004 | Konshak et al. |
| 7,187,547 | B1 | 3/2007 | French et al. |
| 7,215,552 | B2 * | 5/2007 | Shipley ............. H05K 7/20563 165/104.33 |
| 7,518,883 | B1 | 4/2009 | Suitor et al. |
| 7,652,891 | B2 * | 1/2010 | Lucero ..................... G06F 1/20 361/752 |
| 7,952,869 | B2 * | 5/2011 | Lewis, II .......... H05K 7/20736 165/104.33 |
| 8,064,200 | B1 | 11/2011 | West et al. |
| 8,328,026 | B2 | 12/2012 | Boduch et al. |
| 8,730,665 | B2 | 5/2014 | Lewis et al. |
| 2002/0097973 | A1 * | 7/2002 | Petri .................... G02B 6/4459 385/134 |
| 2004/0218355 | A1 | 11/2004 | Bash et al. |

(Continued)

OTHER PUBLICATIONS

"NEBS Requirements: Physical Protection," Telcordia, Issue 3, Mar. 2006, pp. 1-169.

*Primary Examiner* — David M Sinclair
*Assistant Examiner* — Robert Brown
(74) *Attorney, Agent, or Firm* — Clements Bernard Walker PLLC; Christopher L. Bernard; Lawrence A. Baratta, Jr.

(57) ABSTRACT

A chassis supporting a plurality of circuit cards in an electronic and/or optical system includes one or more fans at an output of an exhaust air plenum, wherein the one or more fans are configured to enhance airflow from an intake air plenum to the output; and an airflow divider disposed in the exhaust air plenum and attached or disposed to the chassis, wherein the airflow divider is dimensioned and located in the exhaust air plenum to segment the exhaust air plenum into multiple sections causing balanced airflow from the intake air plenum to the output and over the circuit cards disposed in the chassis for cooling thereof.

18 Claims, 16 Drawing Sheets

(56) References Cited

U.S. PATENT DOCUMENTS

| | | | |
|---|---|---|---|
| 2005/0276017 A1 | 12/2005 | Aziz et al. | |
| 2005/0286222 A1* | 12/2005 | Lucero | H05K 7/20563 361/690 |
| 2007/0274039 A1* | 11/2007 | Hamlin | H05K 7/2019 361/695 |
| 2008/0094799 A1* | 4/2008 | Zieman | G06F 1/20 361/695 |
| 2008/0113604 A1* | 5/2008 | Tufford | G06F 1/20 454/187 |
| 2008/0180903 A1* | 7/2008 | Bisson | H05K 7/20736 361/679.49 |
| 2011/0083824 A1* | 4/2011 | Rogers | H05K 7/20745 165/80.2 |
| 2011/0235272 A1* | 9/2011 | Bash | H05K 7/20609 361/692 |
| 2012/0033379 A1* | 2/2012 | Lam | H05K 7/20145 361/695 |
| 2012/0075803 A1* | 3/2012 | Kobayashi | H05K 7/20572 361/695 |
| 2012/0227930 A1* | 9/2012 | Rowe | H05K 7/20145 165/11.1 |
| 2013/0083481 A1* | 4/2013 | Goto | H05K 7/20209 361/695 |
| 2013/0148298 A1* | 6/2013 | Liu | H05K 7/20145 361/695 |
| 2014/0063737 A1 | 3/2014 | Desmarets | |
| 2014/0078668 A1* | 3/2014 | Goulden | H05K 7/20736 361/679.47 |
| 2014/0113539 A1* | 4/2014 | Dickinson | H05K 7/20581 454/184 |
| 2014/0233183 A1* | 8/2014 | Horng | H05K 7/20145 361/692 |
| 2014/0293532 A1* | 10/2014 | Schelshorn | H05K 7/20145 361/679.53 |

* cited by examiner

AIRFLOW DIVIDER FOR BALANCING AIRFLOW IN A MODULAR CHASSIS SYSTEM

CROSS-REFERENCE TO RELATED APPLICATION(S)

The present non-provisional patent/patent applications claims priority to U.S. Provisional Patent Ser. No. 62/030,956 filed Jul. 30, 2014 and entitled "AIRFLOW DIVIDER FOR BALANCING AIRFLOW IN A MODULAR CHASSIS SYSTEM," the contents of which are incorporated by reference herein.

FIELD OF THE DISCLOSURE

The present disclosure relates generally to cooling systems and methods for high-performance electronic and optical systems. More particularly, the present disclosure relates to balancing airflow in a modular chassis system.

BACKGROUND OF THE DISCLOSURE

Telecommunication, data communication, high-performance computing, and the like systems are typically deployed physically in a chassis. For example, a typical chassis is either 19, ~21, or 23 inches in practice. A rack unit (abbreviated as U or RU) is a unit of measure describing the height of equipment intended for mounting in the chassis, e.g. one RU equals 1.75 inches (44.45 mm) in height. Various standards associated with chassis, racks, or frames are described by Telecordia's GR-63-CORE, "NEBS Requirements: Physical Protection" (04/2012), European Telecoms Standards Institute (ETSI), American National Standard Institute (ANSI), etc. As systems scale in capacity, speed, processing power, etc., cooling becomes a major limiting factor in system design. In chassis-based systems, achieving even airflow distribution across an entire depth (front to back) of plug-in cards is important to ensure proper cooling. Airflow always takes the path of least resistance and techniques must be used to ensure all areas receive adequate airflow so that the electronics and optics are adequately cooled. In a system that has fans distributed in a two dimensional matrix across a top of the chassis, such as illustrated in FIG. 1, the fan configuration ensures even airflow from front to back; however, this technique has disadvantages including 1) additional plenum space is required to turn the air, which increases the overall size of the chassis, 2) air is being turned at the point where speed is highest resulting in an undesirable pressure drop which negatively affects the cooling performance of the system, and the like.

BRIEF SUMMARY OF THE DISCLOSURE

In various exemplary embodiments, a chassis supporting a plurality of circuit cards in a high-performance electronic and/or optical system includes an exhaust air plenum with one or more fans at an output thereof, wherein the one or more fans are configured to cause airflow from an intake air plenum to the output; and an airflow divider disposed in the exhaust air plenum, wherein the airflow divider is dimensioned and located in the exhaust air plenum to maximize negative pressure in front of the chassis, in the exhaust air plenum, and in back of the chassis, in the exhaust air plenum, wherein the maximize negative pressure causes balanced airflow from the intake air plenum to the output and over the circuit cards disposed in the chassis for cooling thereof.

In an exemplary embodiment, a chassis supporting a plurality of circuit cards in an electronic and/or optical system includes one or more fans at an output of an exhaust air plenum, wherein the one or more fans are configured to enhance airflow from an intake air plenum to the output; and an airflow divider disposed in the exhaust air plenum and attached or disposed to the chassis, wherein the airflow divider is dimensioned and located in the exhaust air plenum to segment the exhaust air plenum into multiple sections causing balanced airflow from the intake air plenum to the output and over the circuit cards disposed in the chassis for cooling thereof. The airflow divider can include a front portion, a main portion, and a rear portion, the front portion curving downward towards a bottom of the exhaust air plenum to separate sections thereof, the main portion is substantially flat and connected to the front portion and the main portion extends a portion of depth of the exhaust air plenum, and the rear portion located near the one or more fans. The rear portion can be located near the one or more fans at a downward angle. Also, the rear portion can be located near the one or more fans at a downward angle selected to optimize the airflow.

The airflow divider can be located in the exhaust air plenum in a manner selected to optimize the airflow at an opposite side of the one or more fans. Optionally, a length of the airflow divider is about ⅔ of a depth of the exhaust air plenum. The circuit cards can be selectively engaged in the chassis in a vertical orientation, wherein the airflow is from the intake air plenum, across the circuit cards and output through the exhaust air plenum. Optionally, the circuit cards are selectively engaged in the chassis in a single height configuration. Alternatively, the circuit cards are selectively engaged in the chassis in a double height configuration, wherein the airflow divider is a first airflow divider, and the chassis further includes a second airflow divider disposed in the exhaust air plenum and attached or disposed to the chassis, wherein the first airflow divider and the second airflow divider are dimensioned and located in the exhaust air plenum to segment the exhaust air plenum into multiple sections balanced airflow from the intake air plenum to the output and over the circuit cards disposed in the chassis for cooling thereof.

In another exemplary embodiment, a network element in a chassis supporting a plurality of circuit cards in an electronic and/or optical system includes one or more circuit cards in the chassis; one or more fans at an output of an exhaust air plenum located in the chassis, wherein the one or more fans are configured to enhance airflow from an intake air plenum to the output; and an airflow divider disposed in the exhaust air plenum and attached or disposed to the chassis, wherein the airflow divider is dimensioned and located in the exhaust air plenum to segment the exhaust air plenum into multiple sections causing balanced airflow from the intake air plenum to the output and over the circuit cards disposed in the chassis for cooling thereof. The airflow divider can include a front portion, a main portion, and a rear portion, the front portion curving downward towards a bottom of the exhaust air plenum to separate sections thereof, the main portion is substantially flat and connected to the front portion and the main portion extends a portion of depth of the exhaust air plenum, and the rear portion located near the one or more fans. The rear portion can be located near the one or more fans at a downward angle.

Optionally, the rear portion can be located near the one or more fans at a downward angle selected to optimize the airflow.

The airflow divider can be located in the exhaust air plenum in a manner selected to optimize the airflow at an opposite side of the one or more fans. Optionally, a length of the airflow divider is about ⅔ of a depth of the exhaust air plenum. The circuit cards can be selectively engaged in the chassis in a vertical orientation, wherein the airflow is from the intake air plenum, across the vertically oriented circuit cards and output through the exhaust air plenum. Optionally, the circuit cards can be selectively engaged in the chassis in a single height configuration. Alternatively, the circuit cards can be selectively engaged in the chassis in a double height configuration, wherein the airflow divider is a first airflow divider, and the chassis further includes a second airflow divider disposed in the exhaust air plenum and attached or disposed to the chassis, wherein the first airflow divider and the second airflow divider are dimensioned and located in the exhaust air plenum to segment the exhaust air plenum into multiple sections causing balanced airflow from the intake air plenum to the output and over the circuit cards disposed in the chassis for cooling thereof.

In an further exemplary embodiment, a method, in a chassis supporting a plurality of circuit cards in a high-performance electronic and/or optical system includes providing the chassis with an exhaust air plenum with one or more fans at an output thereof, wherein the one or more fans are configured to cause airflow from an intake air plenum to the output, wherein the exhaust air plenum includes an airflow divider disposed therein; and operating the one or more fans, wherein the airflow divider is dimensioned and located in the exhaust air plenum to segment the exhaust air plenum into multiple sections causing balanced airflow from the intake air plenum to the output and over the circuit cards disposed in the chassis for cooling thereof. The method can further include selecting a location, length, and shape of the airflow divider to optimize the balanced airflow.

BRIEF DESCRIPTION OF THE DRAWINGS

The present disclosure is illustrated and described herein with reference to the various drawings, in which like reference numbers are used to denote like system components/method steps, as appropriate, and in which.

DETAILED DESCRIPTION OF THE DISCLOSURE

Figure 1:
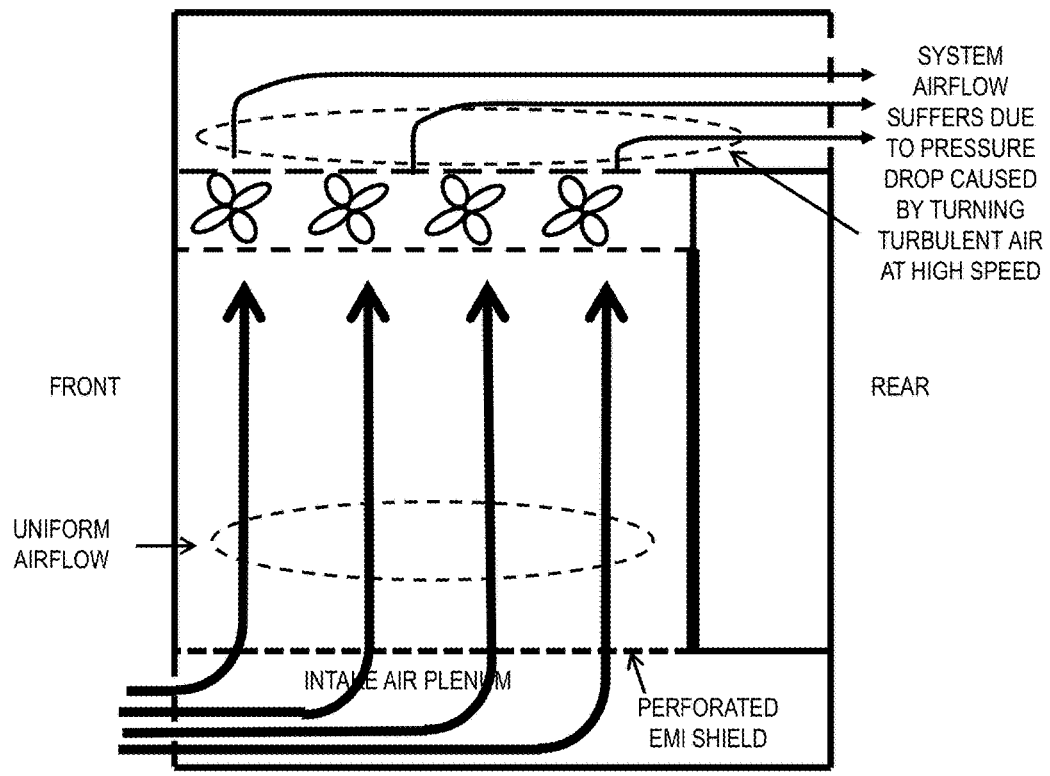
FIG. 1 is a block diagram of a chassis with fans oriented in a two dimensional matrix driving air vertically into exhaust air plenum.

In various exemplary embodiments, the present disclosure balances the front to back distribution of airflow in a chassis without the need for a large exit plenum so that the chassis height can be kept to a minimum. The present disclosure also allows air to be turned when its speed is the slowest thus minimizing the pressure drops that would otherwise impair the overall cooling performance of the system. The present disclosure solves the problem of providing even distribution of airflow in a chassis-based system, resulting in effective cooling of electronics, such as, for example, electronics drawing more than 4 kW of power in a 10 RU chassis height. The solution does not restrict overall airflow through the system to achieve balanced airflow.

Modular chassis based systems typically employ two methods in the design of forced air cooling. The air intake plenum is usually at the bottom of the chassis and the fans are located at the top of the chassis; although the opposite is also contemplated. Fans are oriented in one of two ways: a) fans oriented in a two dimensional matrix driving air vertically into an exhaust air plenum (see FIG. 1), or b) fans are oriented at the back (or front) of the chassis, driving the air out horizontally (see FIG. 2). Both of these approaches have drawbacks that reduce overall airflow through the system.

As stated above, the state-of-the-art solutions for balancing airflow in modular chassis systems results in compromises to overall system airflow and therefore the cooling performance of the system by two mechanisms, 1) balancing airflow by use of a two dimensional matrix of fans which requires turbulent air to be turned at high speed to prevent the exhaust air plenum from becoming excessively large; turning turbulent air at high speeds results in reduction in overall system airflow, or 2) balancing airflow by restricting airflow in natural path the air would follow with the resulting disadvantage of a reduction in overall system airflow. The present state-of-the-art approaches to airflow management are suboptimal because they restrict airflow and in some cases require large exhaust air plenums which increase the chassis size.

In various exemplary embodiments, a chassis is described herein supporting a plurality of circuit cards in a high-performance electronic and/or optical system includes an exhaust air plenum with one or more fans at an output thereof, wherein the one or more fans are configured to cause airflow from an intake air plenum to the output; and an airflow divider disposed in the exhaust air plenum, wherein the airflow divider is dimensioned and located in the exhaust air plenum to maximize negative pressure in front of the chassis and in back of the chassis in the exhaust air plenum, wherein the maximize negative pressure causes balanced airflow from the intake air plenum to the output and over the circuit cards for cooling thereof.

Referring to FIGS. 2-5, in an exemplary embodiment, a block diagram illustrates a chassis 10 with fans 12 oriented at the back of the chassis 10. The chassis 10 includes the exhaust air plenum 14, with the fans 12 in-line therewith, and an intake air plenum 16 configured to receive air intake. In the various exemplary embodiments described herein, the exhaust air plenum 14 is illustrated at a top of the chassis 10 with the fans 12 at a rear of the chassis 10, and the intake air plenum 16 is illustrated at a bottom of the chassis 10 with air intake 18 at a front of the chassis 10. Note, the present disclosure contemplates different variations such as swapping the locations of the exhaust air plenum 14 and the intake air plenum 16 or swapping the locations of the fans 12 and the air intake 18. The key is that the exhaust air plenum 14 and the intake air plenum 16 are at opposite locations and the fans 12 and the air intake 18 are at opposite locations to form airflow 20 through the chassis 10.

Figure 2:
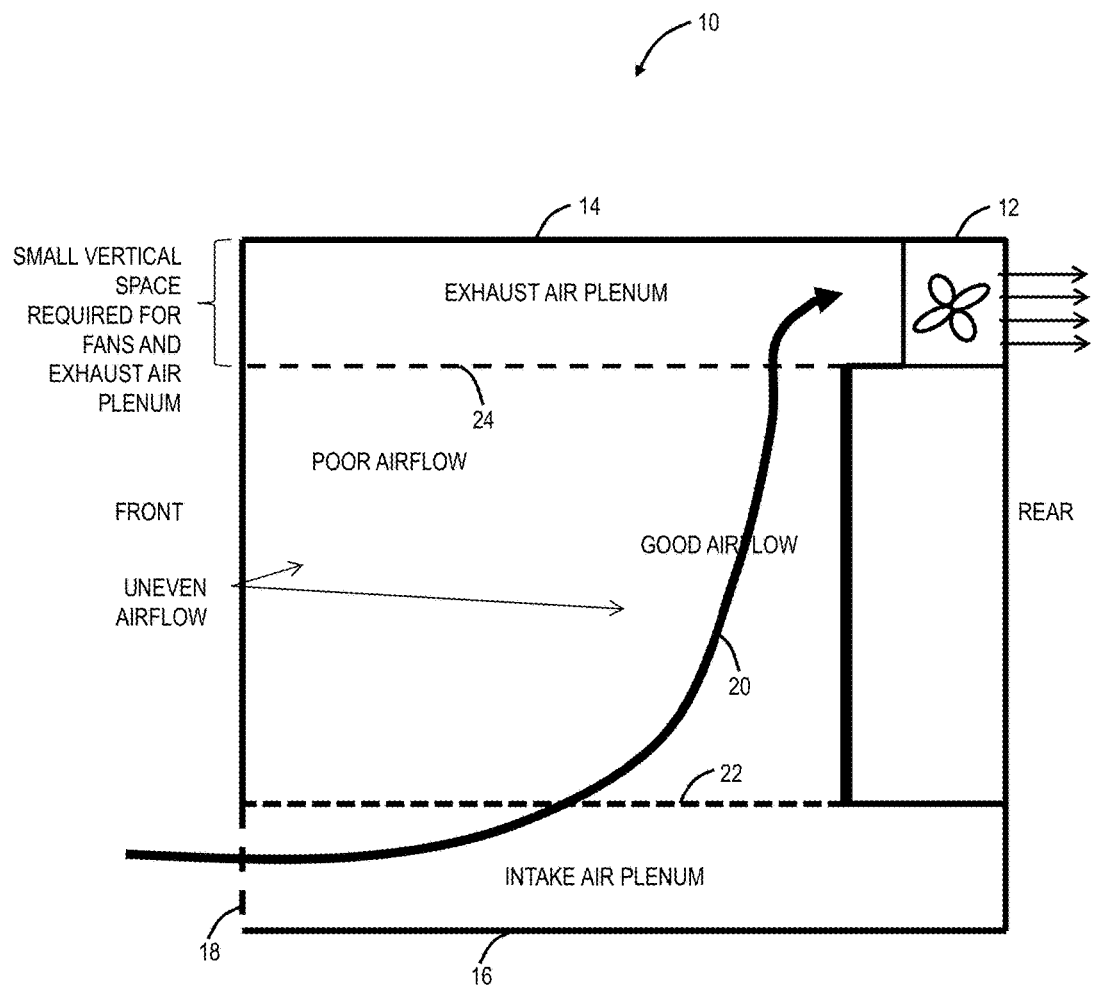
FIG. 2 is a block diagram of a chassis with fans oriented at the back (or front) of the chassis driving air out horizontally.
Figure 3:
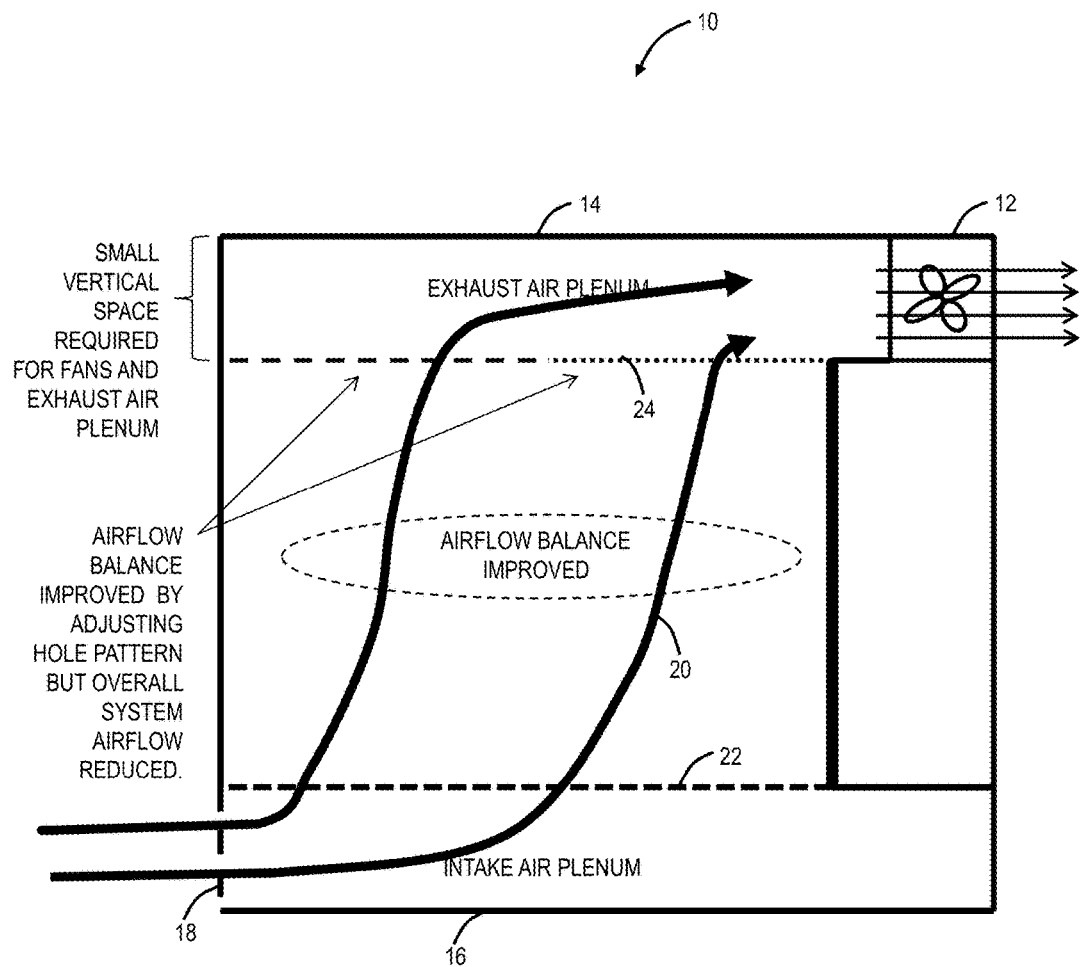
FIG. 3 is a block diagram of a chassis with fans oriented at the back (or front) of the chassis, driving the air out horizontally, such as in FIG. 2, with adjusted hole patterns in an Electromagnetic Interference (EMI) shield.
Figure 4:
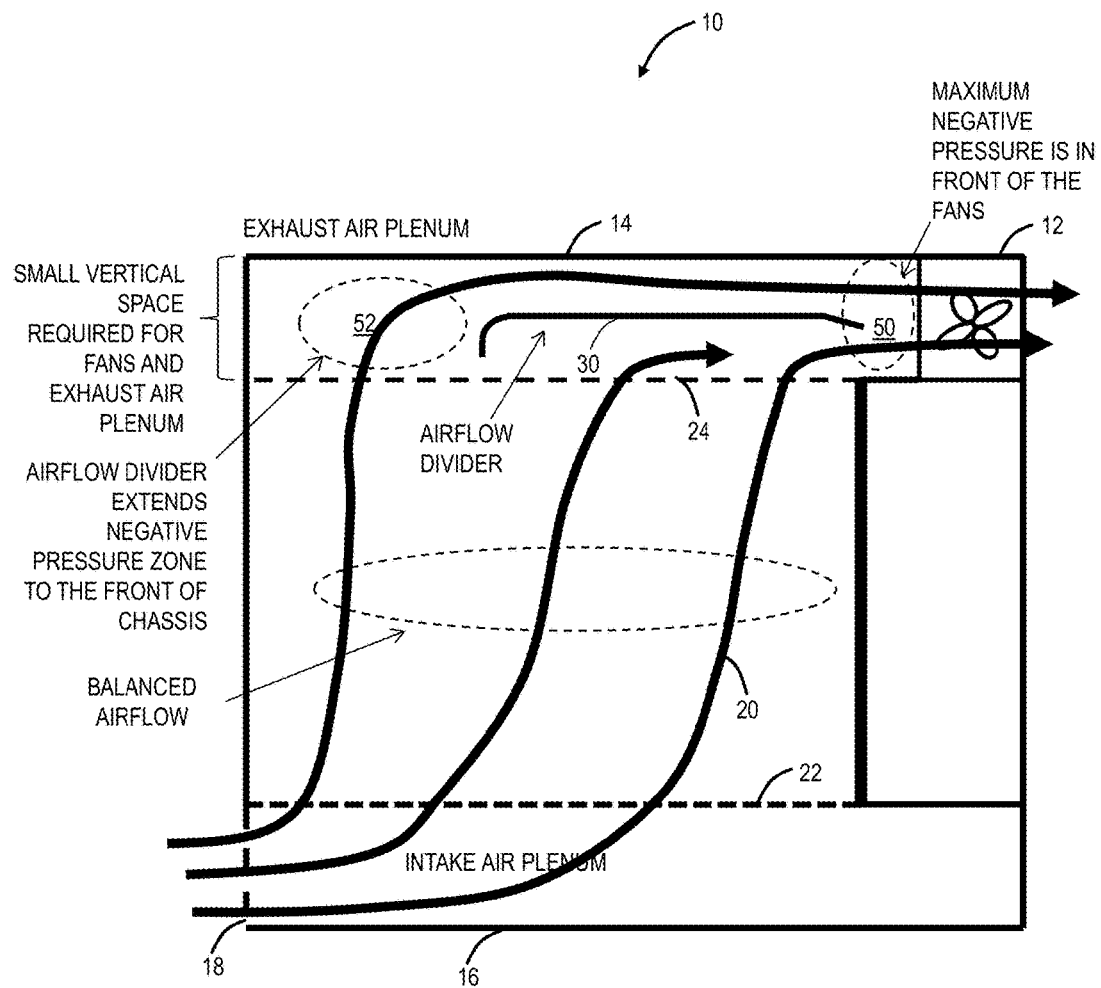
FIG. 4 is a block diagram of a chassis with fans oriented at the back (or front) of the chassis, driving the air out horizontally, such as in FIGS. 2 and 3, with adjusted hole patterns in an Electromagnetic Interference (EMI) shield for the intake air plenum and with an air divider in the exhaust air plenum to adjust negative pressure zones to balance airflow.
Figure 5:
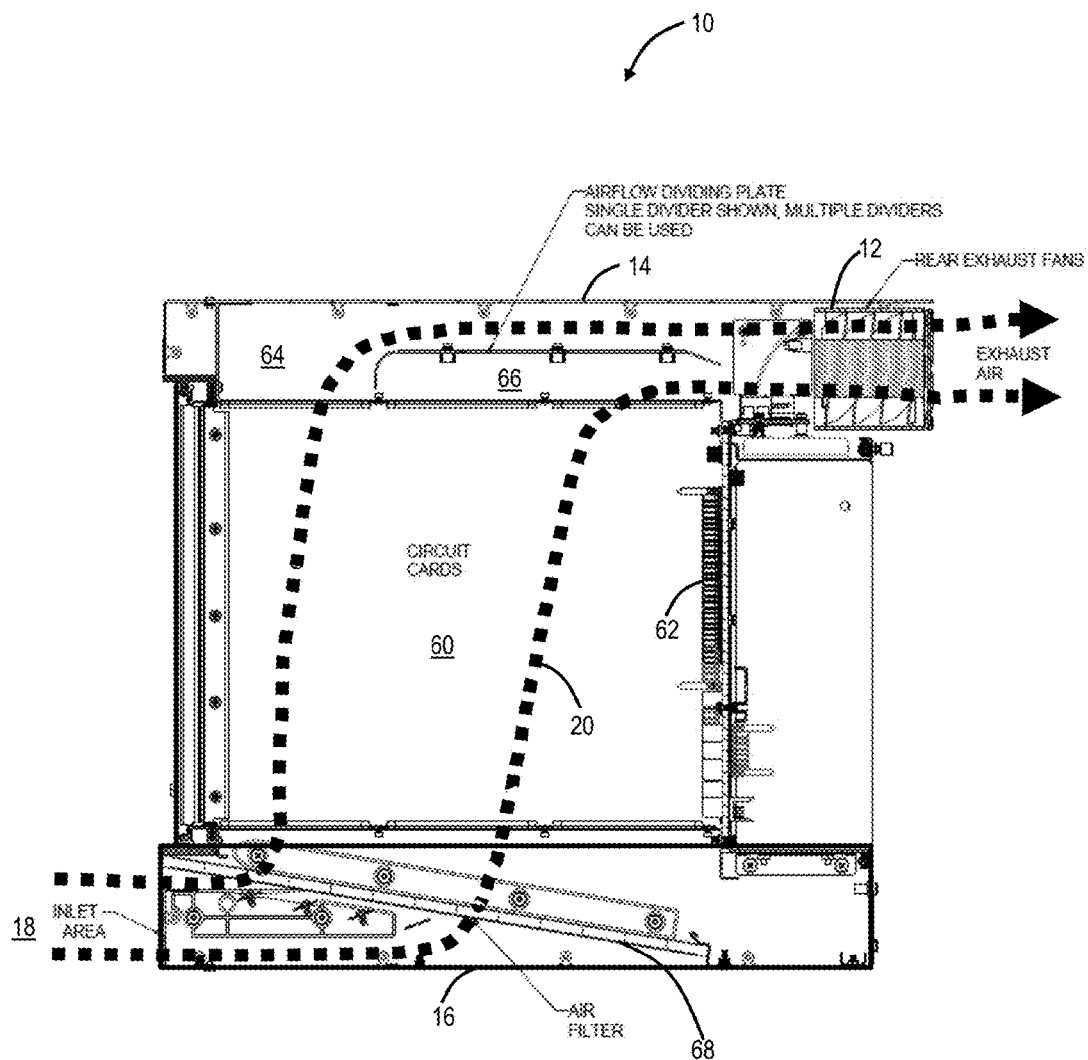
FIG. 5 is a block diagram of the chassis of FIG. 4 with circuit cards included therein illustrating the balanced airflow.

FIG. 2 is a block diagram of the chassis 10 with fans 12 oriented at the back (or front) of the chassis 10 driving the air out horizontally. FIG. 3 is a block diagram of the chassis 10 with the fans 12 oriented at the back (or front) of the chassis 10 driving the air out horizontally, such as in FIG. 2, with adjusted hole patterns in an Electromagnetic Interference (EMI) shield 22, 24. FIG. 4 is a block diagram of the chassis 10 with fans oriented at the back (or front) of the chassis 10 driving the air out horizontally, such as in FIGS. 2 and 3, with adjusted hole patterns in the Electromagnetic Interference (EMI) shield 22 for the intake air plenum 16 and with an airflow divider 30 in the exhaust air plenum 14 to adjust negative pressure zones to balance the airflow 20. FIG. 5 is a block diagram of the chassis 10 of FIG. 4 with circuit cards included therein illustrating the balanced airflow.

When compared to the two-dimensional matrix of fans in FIG. 1, the chassis 10 has the advantage of including the fans 12 in-line with an exhaust air plenum 14. For example, the chassis 10 can be a 10 RU high, whereas, with the two-dimensional matrix, a same chassis would need to be 12 RU high to accommodate the two-dimensional matrix. Additionally, including the fans 12 in-line with the exhaust air plenum 14 improves airflow in the exhaust air plenum 14. Further, the chassis 10 requires less of the fans 12 relative to the two-dimensional matrix. For example, in one embodiment, the two-dimensional matrix requires 16 fans while the chassis 10 requires only 5 of the fans 12, for the same amount of space.

Also, when fans are oriented in a two dimensional matrix at the top of the chassis the air must be turned to allow for it to exit at the rear of the chassis which is a requirement in most chassis environments. Turning turbulent air requires space which requires the exhaust air plenum to be large increasing overall chassis size, reducing available space for electronics and/or optics. There is a significant pressure drop caused by turning turbulent air at highest speed which, in this configuration, is as the air exits the impellors (see FIG. 1). This pressure drop reduces overall system airflow, which adversely affects the cooling performance of the system.

In a system with fans located at the back of a deep shelf, it is difficult to maintain sufficient airflow at the top front of the shelf (see FIG. 2). This is due to the fans 12, being in-line with the exhaust air plenum 14 causes the airflow 20 towards the rear of the chassis 10, leaving poor airflow in the front of the chassis 10. Note, the EMI shield 24 in the exhaust air plenum 14 includes uniform perforations in FIG. 2.

In FIG. 3, this same fan configuration airflow in the chassis 10 can be improved by restricting airflow at the back of the chassis 10 by using fewer or smaller ventilation holes in the EMI shield 24, but this results in a significant reduction in total system airflow which adversely affects the cooling performance of the system (See FIG. 3).

In an exemplary embodiment, an airflow divider 30 is inserted into the exhaust air plenum 14 creating upper and lower exit air paths. The upper air exit path creates a high negative air pressure area at a top front of the chassis 10 balancing the front to back airflow in the chassis 10 without reducing overall airflow through the chassis 10 (See FIG. 4). The airflow divider 30 can be designed so that its location can be changed during product designer testing so the optimal location can be found empirically or the results of simulations can be verified. In an exemplary embodiment, the airflow divider 30 extends about ⅔ of the length of the exhaust air plenum 14, with the first ⅓ of the length of the exhaust air plenum 14 open. Other embodiments are also contemplated.

FIG. 4 is a block diagram of the chassis 10 with the fans 12 oriented at the back (or front) of the chassis 10 driving the air out horizontally, such as in FIGS. 2 and 3, with an airflow divider 30 in the exhaust air plenum 14 to adjust negative pressure zones 50, 52 to balance airflow. The present disclosure includes the airflow divider 30 (e.g., bent sheet-metal or the like) that extends the negative pressure zones 50, 52 from the area directly in front of the fans 12 up to the front of the chassis 10. This creates balance in the airflow 20 between the front and the back of the chassis 10 resulting in more uniform cooling of electronics. It improves total airflow by reducing both the turbulence in the exhaust air plenum 14 and the mixing of air entering the exhaust plenum at different speeds. The reduction in the size of the exhaust air plenum 14 and the space for fans 12 results in a chassis size that is smaller than what can be achieved without this disclosure. Using the airflow divider 30 between the chassis 10 and the fans 12, allows the air to be balanced as required while maximizing total airflow, and minimizing the height of the chassis 10 relative to the two-dimensional matrix. This disclosure allows, for example, a product to fit in a 10 RU height, rather than 11-12 RU height.

FIG. 5 is a block diagram of the chassis 10 of FIG. 4 with circuit cards 60 included therein illustrating the balanced airflow. The circuit cards 60 can include transceivers, switch modules, blade servers, and the like. The chassis 10 can be for a network element in a communication network. As functionality increases in networks, the chassis 10 has to support higher power consumption in less real estate. The circuit cards 60 are selectively inserted into the chassis 10 in a vertical orientation, connecting to a backplane 62 associated with the chassis 10. Electric circuitry and/or optoelectronics are disposed on the circuit cards 60. The airflow 20 flows from the intake air plenum 16, from the air intake 18, over the circuit card 60 to the exhaust air plenum 14, thereby cooling the circuit cards 60. The intake air plenum can include an air filter 68 configured to filter particulates out of the airflow 20 prior to the airflow 20 entering over the circuit cards 60.

The airflow divider 30 extends the width of the exhaust air plenum 14 acting as a divider plate to separate the exhaust air plenum 14 into two sections 64, 66, with different overall area. The front section 64 is in the front of the chassis 10, and has a larger area than the rear section 66, at the back of the chassis 10.

Figure 6:
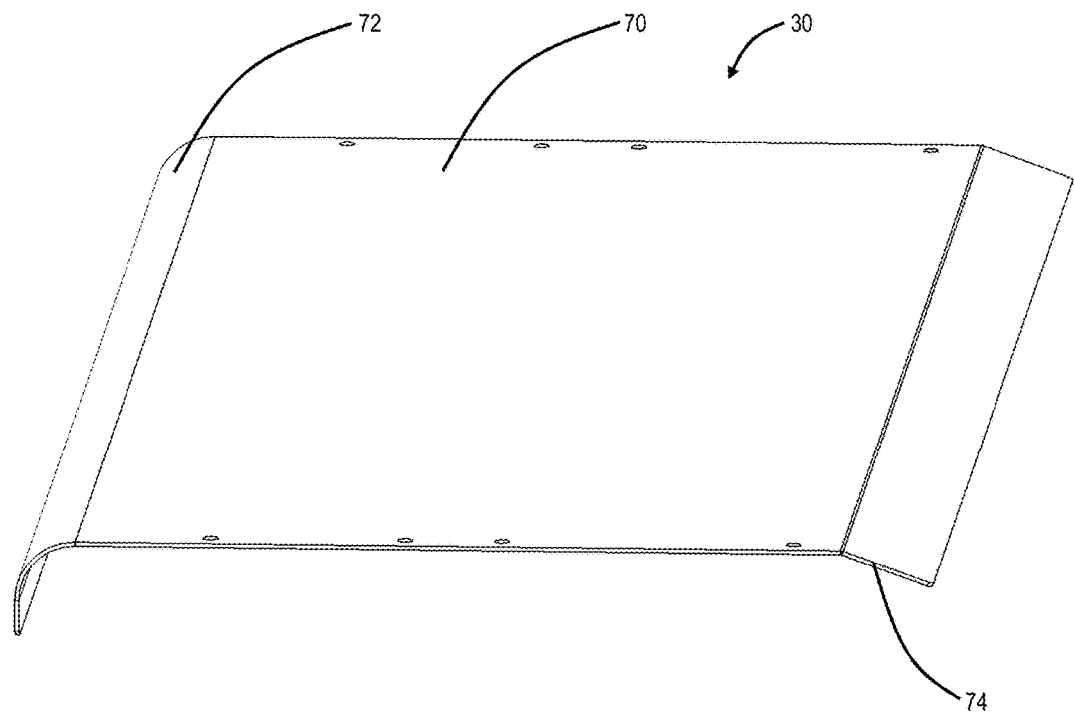
FIG. 6 is a perspective diagram of the air divider, not installed in the exhaust air plenum.

Referring to FIGS. 6-12, in an exemplary embodiment, various perspective diagrams illustrate the chassis 10 in a single height configuration. FIG. 6 is a perspective diagram of the airflow divider 30, not installed in the exhaust air plenum 14. The airflow divider 30 includes a main portion 70 that is substantially flat in a horizontal plane, a front portion 72, and a rear portion 74. The main portion 70 is attached to sides 76, 78 of the exhaust air plenum 14. The main portion 70, the front portion 72, and the rear portion 74 can be integrally formed or attached to one another.

The front portion 72 curves away from the main portion 70 and extends downward vertically to the EMI shield 24 at a bottom of the exhaust air plenum 14. In this manner, the front portion 72 separates the front section 64 of the exhaust air plenum 14 from the rear portion 74.

It has been determined that there are generally two variables associated with the airflow divider 30, for optimal airflow in the exhaust air plenum 14, namely 1) location of the airflow divider 30 in the exhaust air plenum 14, i.e. moving the airflow divider 30 back and forth, and 2) a downward angle of the rear portion 74. The angle of the rear portion 74 is at the rear of the chassis 10, where the fans 12 are located. The angle makes the front section 64 effectively larger than the rear section 66 at the fans 12. In various exemplary embodiments, the angle of the rear portion 74 can be between 0 and 60 degrees, preferably about 20 degrees.

In an exemplary embodiment, the location of the airflow divider 30 is about ⅓ distance from the front of the chassis 10 extending to the fans 12 at the rear of the chassis 10, thereby covering about ⅔ of the exhaust air plenum 14. For example, if the chassis 10 has a depth of about 15" from the front to the backplane 62, the airflow divider 30 is about 10" in depth.

Figure 7:
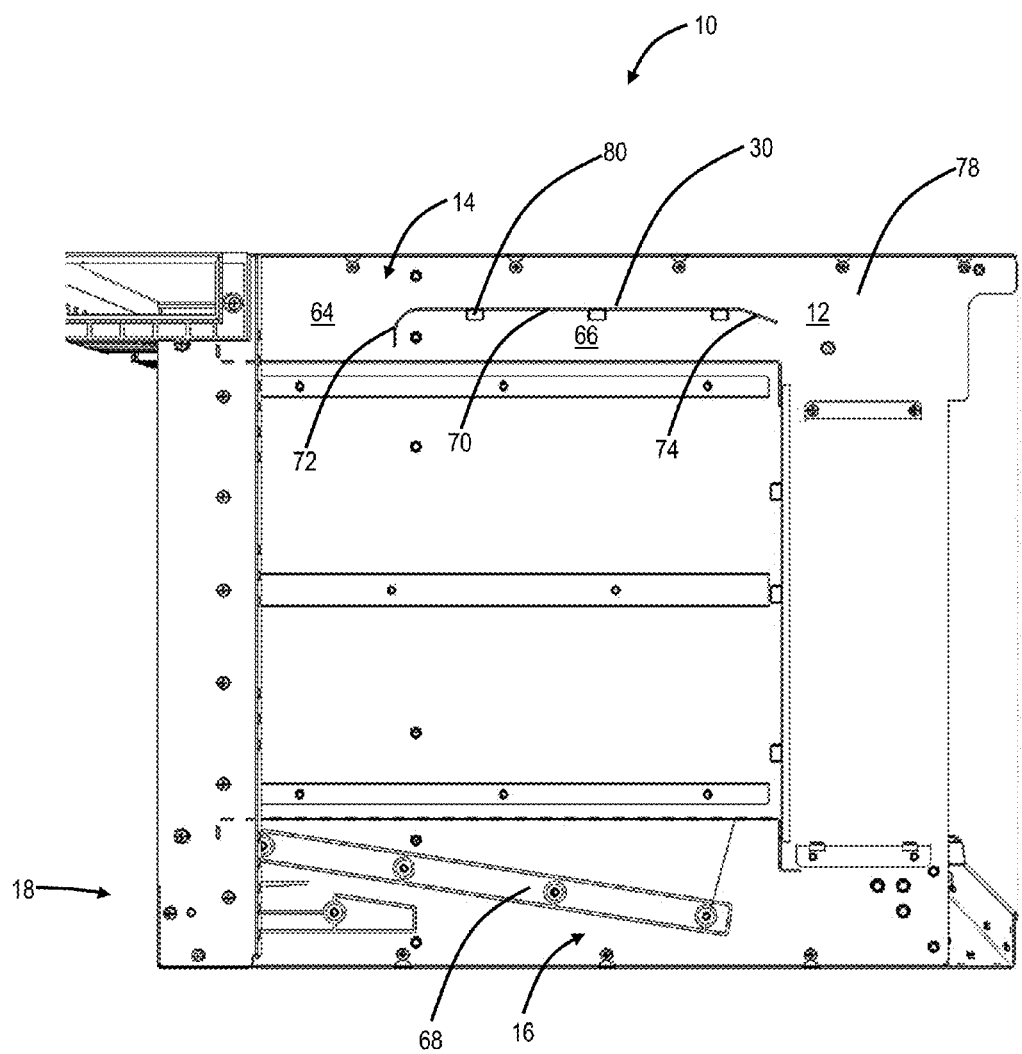
FIG. 7 is a side perspective view of the chassis showing the air divider attached to the right side of the exhaust air plenum.

FIG. 7 is a side perspective view of the chassis 10 showing the airflow divider 30 attached to the right side 78 of the exhaust air plenum 14. Here, the main portion 70 is attached, via attachments 80, to each of the sides 76, 78 of the exhaust air plenum 14. The attachments 80 can include any attachment mechanisms known in the art. The air filter 68 is angled within the intake air plenum 16 such that air entering the air intake 18 horizontally is filtered as it is drawn vertically by the fans 12.

Figure 8:
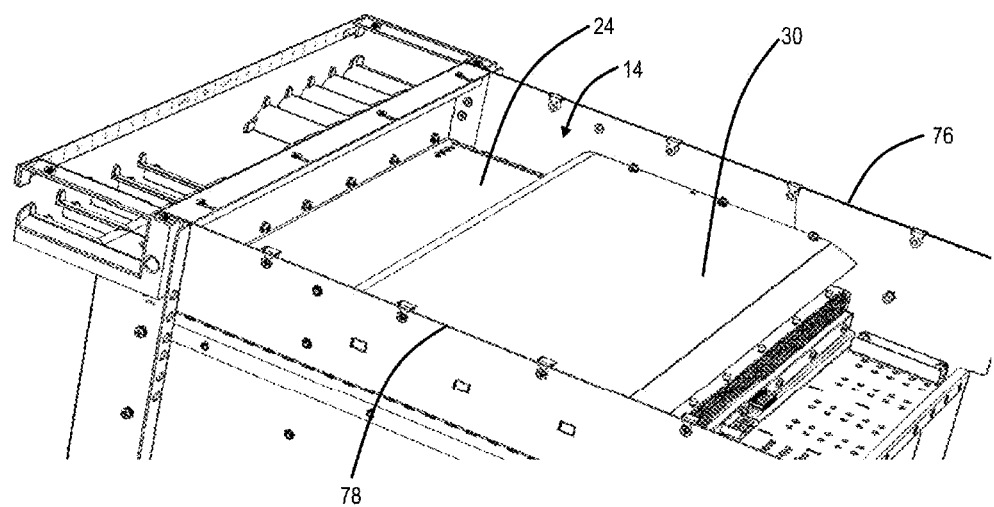
FIGS. 8 and 9 are top perspective views of the chassis showing the exhaust air plenum with its top removed and with (FIG. 8) and without (FIG. 9) the right side of the chassis.
Figure 9:
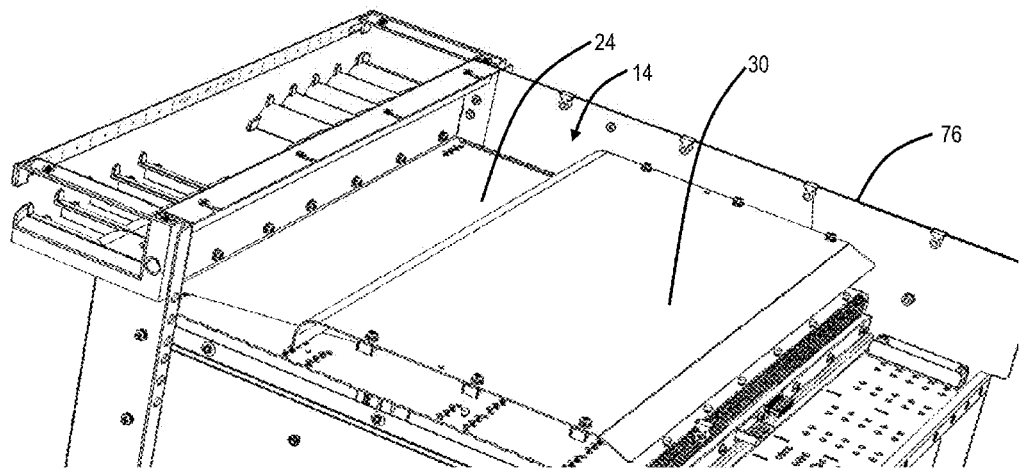

FIGS. 8 and 9 are top perspective views of the chassis 10 showing the exhaust air plenum 14 with its top removed and with (FIG. 8) and without (FIG. 9) the right side of the chassis 10. As can be seen here, the airflow divider 30 segments the exhaust air plenum 14 into the sections 64, 66 enabling negative pressure in the front of the chassis 10 so that airflow is balanced across the circuit cards 60.

Figure 10:
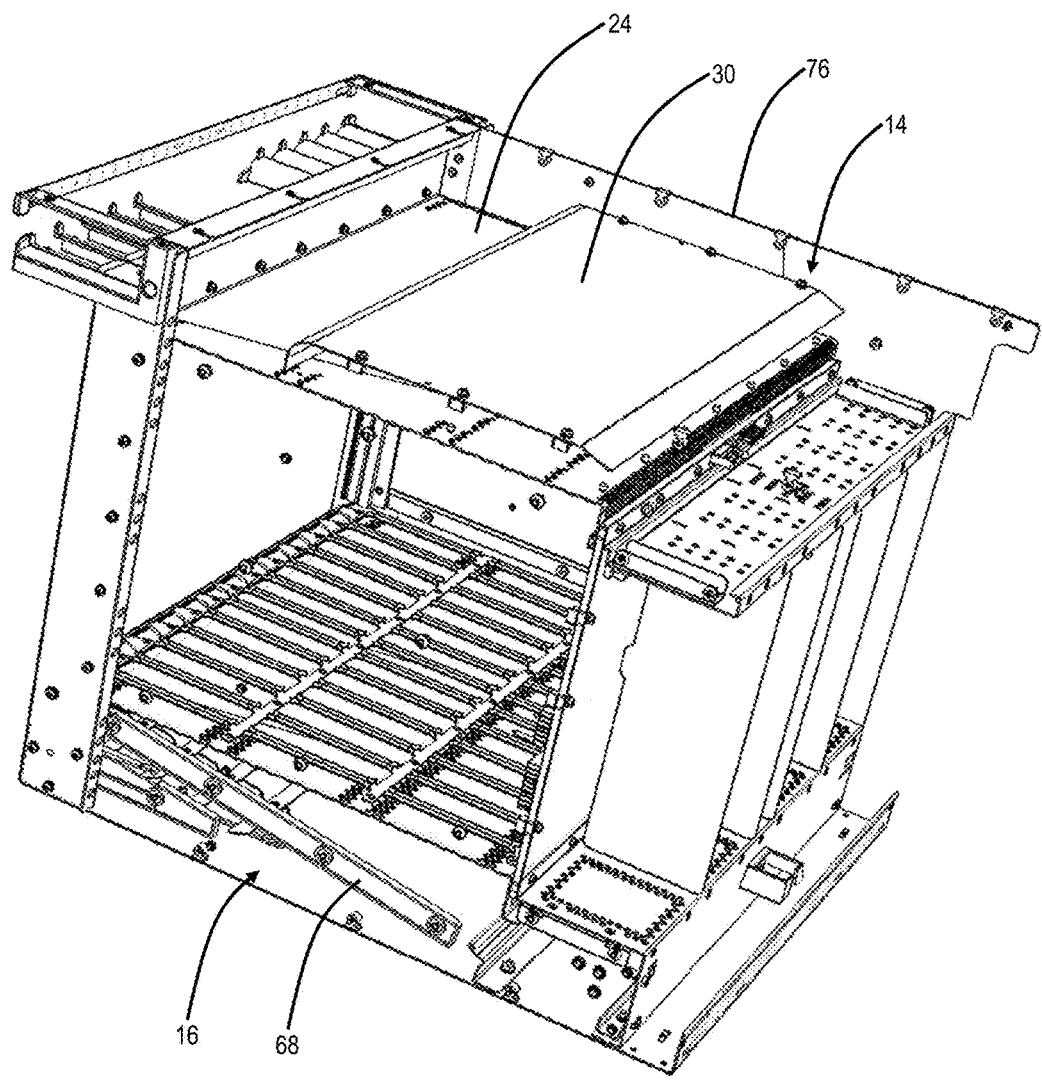
FIGS. 10, 11, and 12 are various perspective views of the chassis with the top of the exhaust air plenum removed and the right side of the chassis removed.
Figure 11:
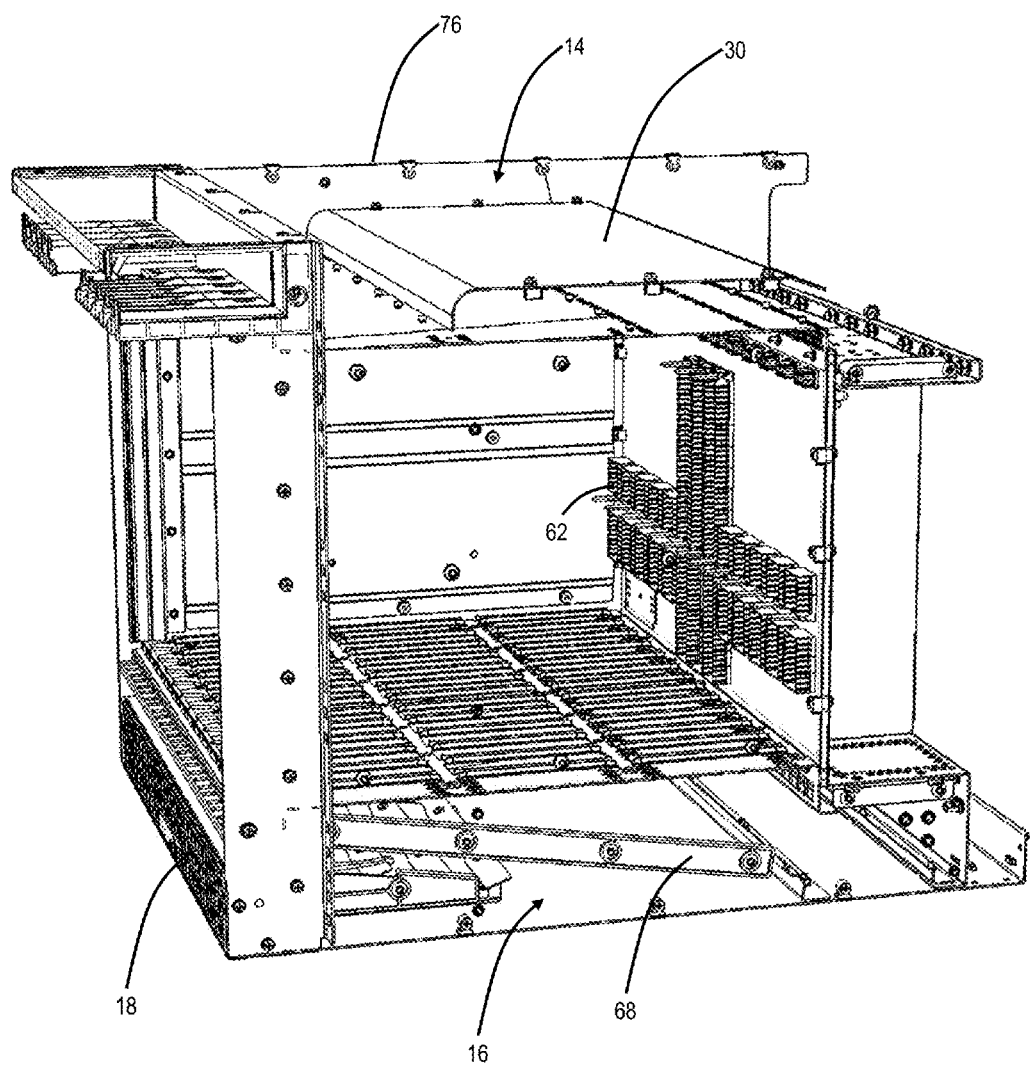
Figure 12:
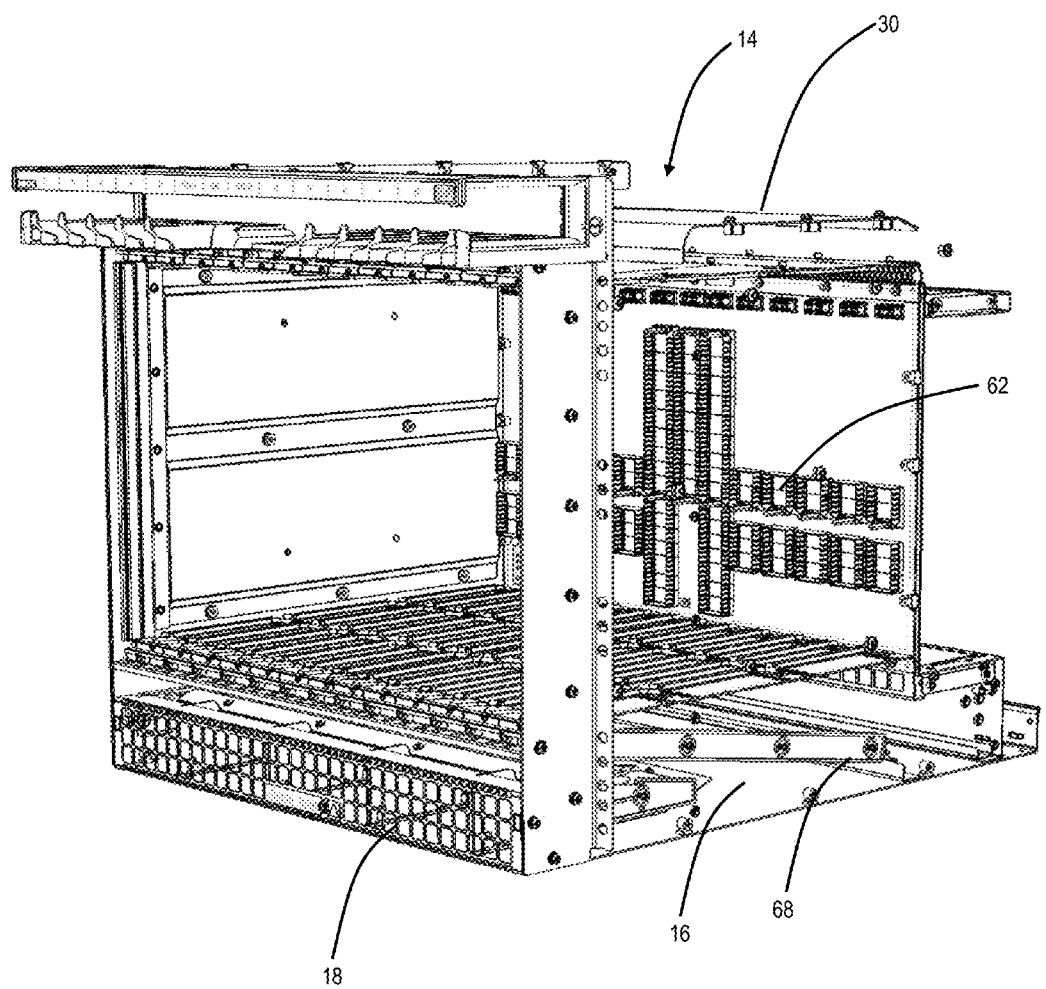

FIGS. 10, 11, and 12 are various perspective views of the chassis 10 with the top of the exhaust air plenum 14 removed and the right side 78 of the chassis 10 removed. The air intake 18, in the front of the chassis 10, can include a grill or the like.

Referring to FIGS. 13-18, in an exemplary embodiment, various perspective diagrams illustrate a chassis 100 in a double height configuration. For the chassis 10, a single set of circuit cards 60 are supported, whereas the double height configuration supports stacking of the circuit cards 60. For example, if the chassis 10 has a height of 10 RU, the chassis 100 has a height of 20 RU. The chassis 100 includes a similar configuration as the chassis 10.

Figure 13:
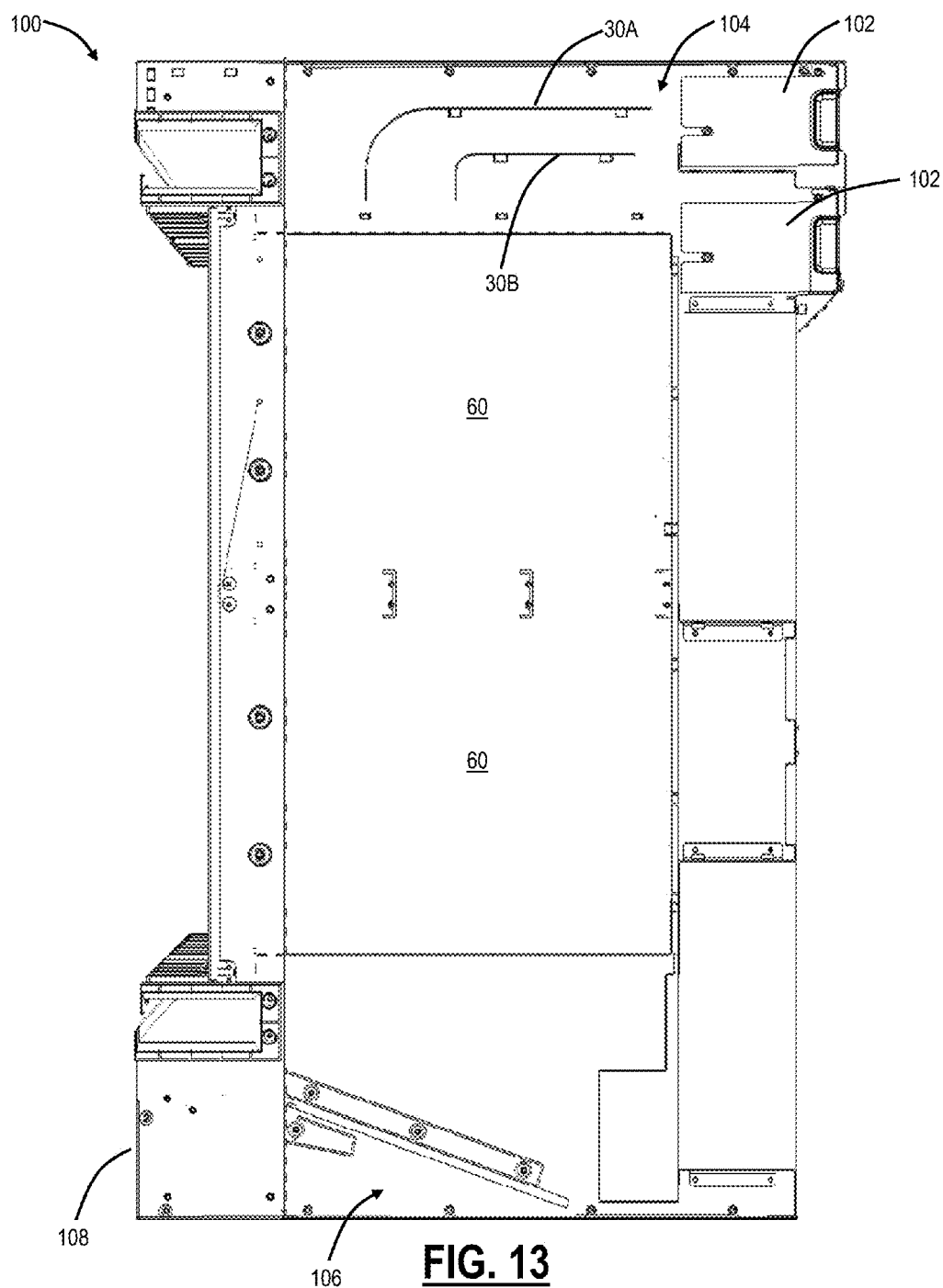
FIGS. 13-18 are various perspective diagrams illustrate a chassis in a double height configuration, in comparison to the chassis of FIGS. 1-12 which are in a single height configuration.
Figure 14:
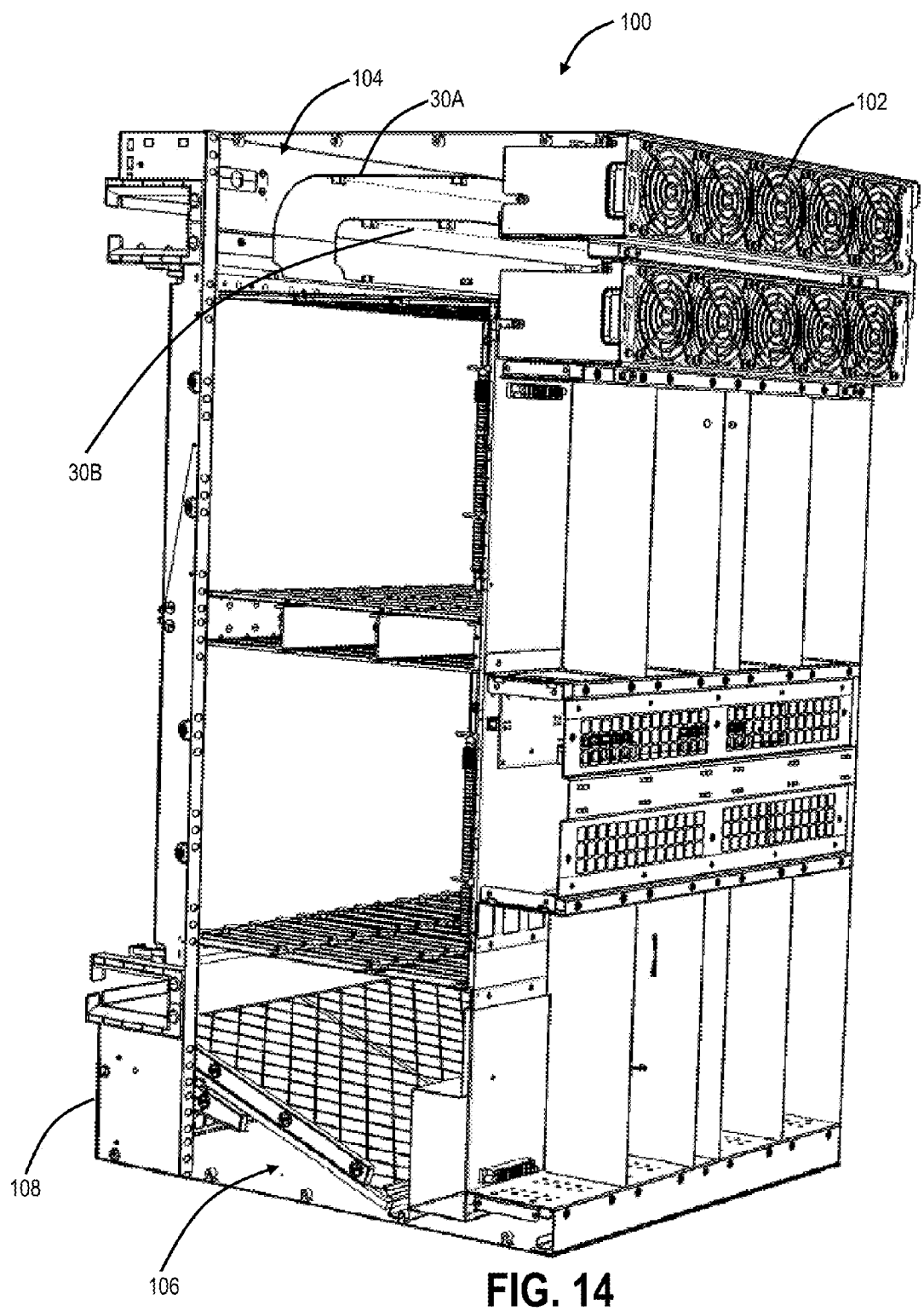

FIG. 13 is a side view and FIG. 14 is a perspective view with the right side of the chassis 100 removed. The chassis 100 includes two sets of fans 102, in a stacked configuration, an exhaust air plenum 104, an intake air plenum 106, an air intake 108, and the like. Here, the exhaust air plenum 104 also includes the two sets of fans 102 in-line, and thus is about twice the height of the exhaust air plenum 14. The exhaust air plenum 104 includes two air dividers 30A, 30B.

Figure 15:
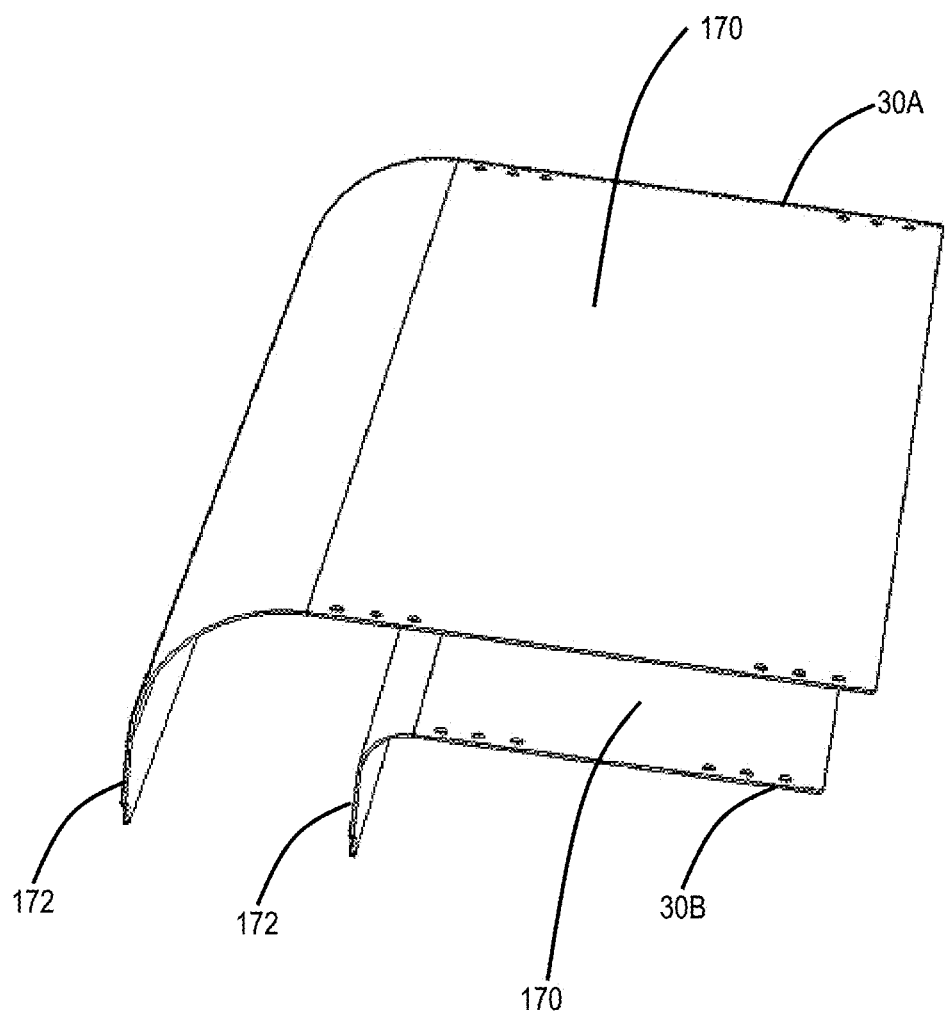

FIG. 15 is a perspective view of the air dividers 30A, 30B. Here, the air dividers 30A, 30B. With the double height configuration, the two air dividers 30A, 30B form three sections in the exhaust air plenum 104. The two air dividers 30A, 30B each includes a main portion 170 and a front portion 172. The two air dividers 30A, 30B do not include the rear portion as in the airflow divider 30 for the chassis 10.

Figure 16:
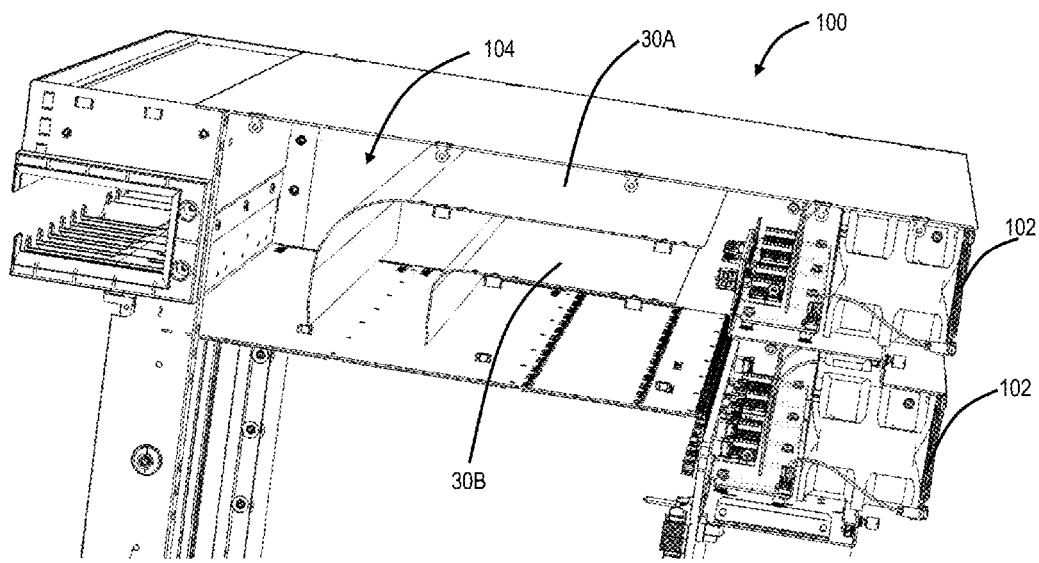
Figure 17:
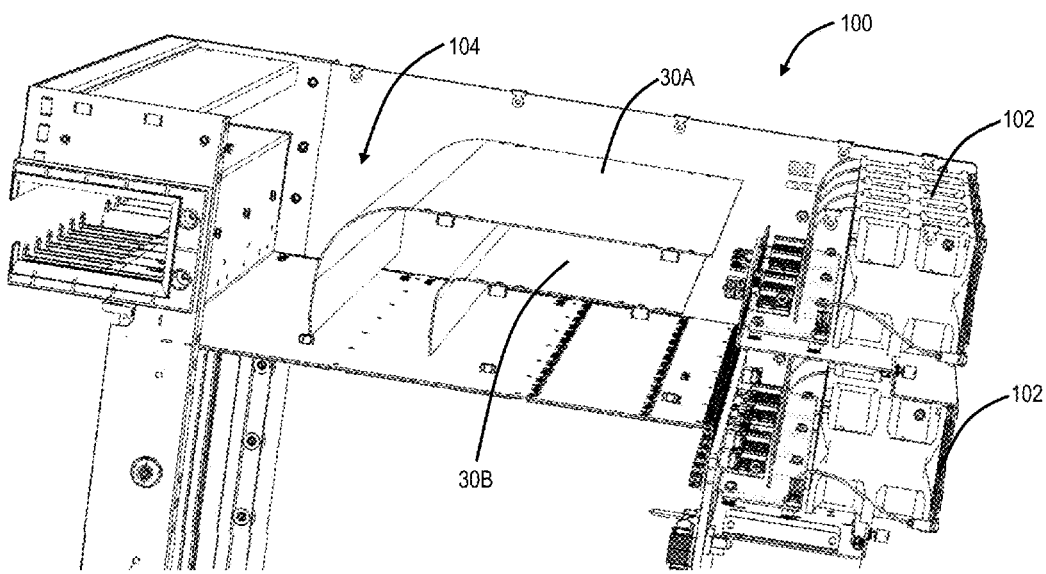
Figure 18:
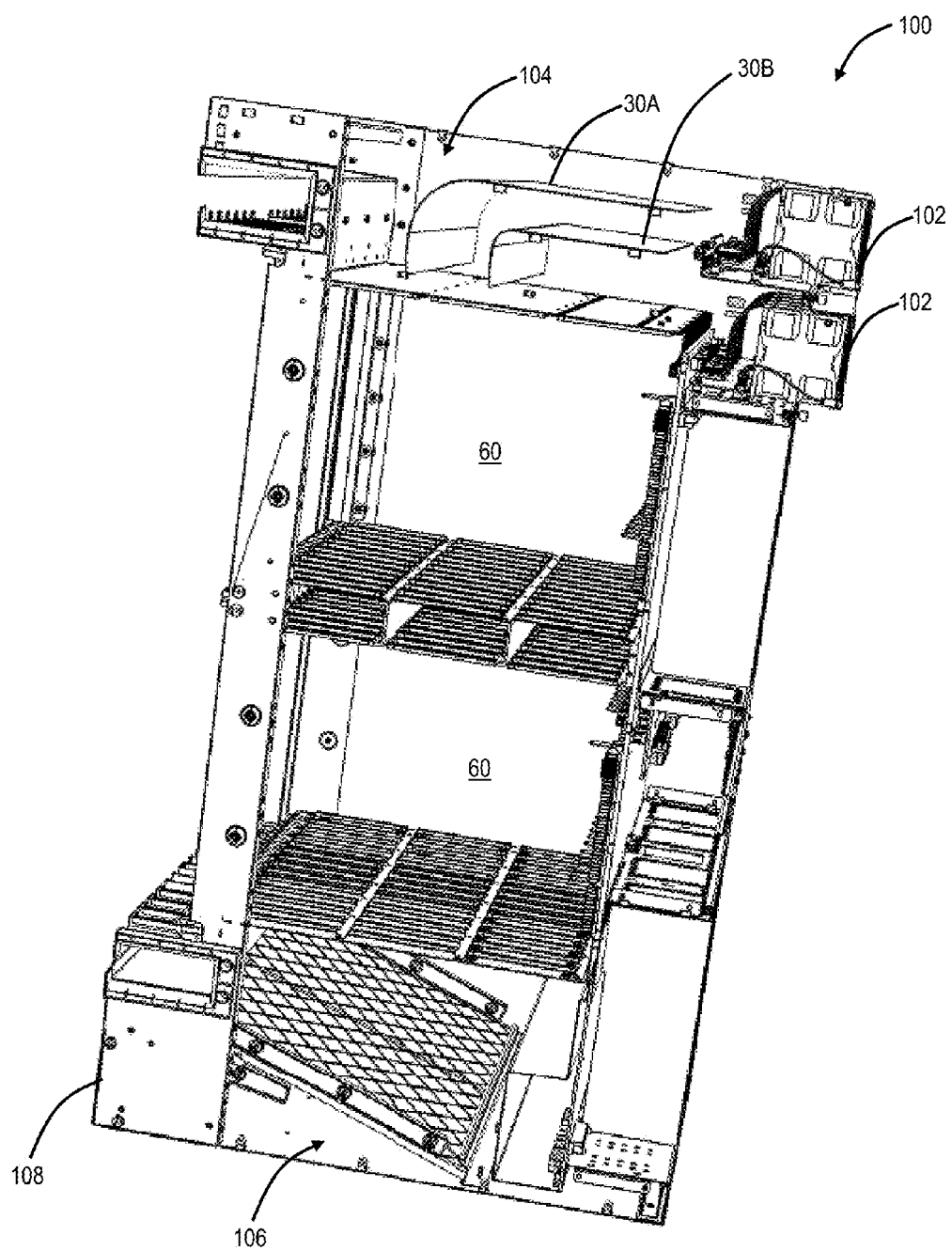

FIGS. 16 and 17 are perspective views of a top of the chassis 100 with the right side removed and with (FIG. 16) and without (FIG. 17) a top of the exhaust air plenum 104. FIG. 18 is a side perspective view of the chassis 100 with the right side and the top of the exhaust air plenum 104 removed.

Note, functionally, operation of the airflow in the chassis 100 is similar to the airflow in the chassis 10. Again, the chassis 10, 100 have been described with the exhaust air plenums 14, 104 at the top and the intake air plenums 16, 106 at the bottom, and these locations can be switched. Also, the air intake 18, 108 is illustrated at a front of the chassis 10, 100 and the fans 12, 102 are illustrated at a rear of the chassis 10, 100, and these can also be switched. The airflow divider 30, 30A, 30B enables balanced airflow through the circuit cards 60 and avoids the space associated with the two dimensional matrix of fans.

In an exemplary embodiment, a chassis 10, 100 supporting a plurality of circuit cards 60 in an electronic and/or optical system includes one or more fans 12, 102 at an output of an exhaust air plenum 14, 104, wherein the one or more fans 12, 102 are configured to enhance airflow from an intake air plenum 16, 106 to the output; and an airflow divider 30 disposed in the exhaust air plenum 14, 104 and attached or disposed to the chassis 10, 100m wherein the airflow divider 30 is dimensioned and located in the exhaust air plenum 14, 104 to segment the exhaust air plenum into multiple sections causing balanced airflow from the intake air plenum 16, 106 to the output and over the circuit cards 60 disposed in the chassis 10, 100 for cooling thereof. The airflow divider 30 can include a front portion 72, a main portion 70, and a rear portion 74, the front portion 72 curving downward towards a bottom of the exhaust air plenum 30 to separate sections thereof, the main portion 70 is substantially flat and connected to the front portion 72 and the main portion 70 extends a portion of depth of the exhaust air plenum 30, and the rear portion 74 located near the one or more fans 12, 102. The rear portion 74 can be located near the one or more fans 12, 102 at a downward angle. Also, the rear portion 74 can be located near the one or more fans 12, 102 at a downward angle selected to optimize the airflow.

The airflow divider 30 can be located in the exhaust air plenum 14, 104 in a manner selected to optimize the airflow at an opposite side of the one or more fans 12, 102. Optionally, a length of the airflow divider 30 is about ⅔ of a depth of the exhaust air plenum 14, 104. The circuit cards 60 can be selectively engaged in the chassis 10, 100 in a vertical orientation, wherein the airflow is from the intake air plenum 16, 106, across the circuit cards 60 and output through the exhaust air plenum 14, 104. Optionally, the circuit cards 60 are selectively engaged in the chassis 10, 100 in a single height configuration. Alternatively, the circuit cards 60 are selectively engaged in the chassis 10, 100 in a double height configuration, wherein the airflow divider 30 is a first airflow divider 30A, and the chassis 10, 100 further includes a second airflow divider 30B disposed in the exhaust air plenum 14, 104 and attached or disposed to the chassis 10, 100, wherein the first airflow divider 30A and the second airflow divider 30B are dimensioned and located in the exhaust air plenum 14, 104 to segment the exhaust air plenum 14, 104 into multiple sections balanced airflow from the intake air plenum 16, 106 to the output and over the circuit cards disposed in the chassis for cooling thereof.

In another exemplary embodiment, a network element in a chassis 10, 100 supporting a plurality of circuit cards 60 in an electronic and/or optical system includes one or more circuit cards 60 in the chassis 10, 100; one or more fans 12, 102 at an output of an exhaust air plenum 14, 104 located in the chassis 10, 100, wherein the one or more fans 12, 102 are configured to enhance airflow from an intake air plenum 16, 106 to the output; and an airflow divider 30 disposed in the exhaust air plenum 14, 104 and attached or disposed to the chassis 10, 100, wherein the airflow divider 30 is dimensioned and located in the exhaust air plenum 14, 104 to segment the exhaust air plenum 14, 104 into multiple sections causing balanced airflow from the intake air plenum 16, 106 to the output and over the circuit cards 60 disposed in the chassis 10, 100 for cooling thereof. The airflow divider 30 can include a front portion 72, a main portion 70, and a rear portion 74, the front portion 72 curving downward towards a bottom of the exhaust air plenum 14, 104 to separate sections thereof, the main portion 70 is substantially flat and connected to the front portion 72 and the main portion 70 extends a portion of depth of the exhaust air plenum 14, 104, and the rear portion 74 located near the one or more fans 12, 102. The rear portion 74 can be located near the one or more fans 12, 102 at a downward angle. Optionally, the rear portion can be located near the one or more fans 12, 102 at a downward angle selected to optimize the airflow.

The airflow divider 30 can be located in the exhaust air plenum 14, 104 in a manner selected to optimize the airflow at an opposite side of the one or more fans 12, 102. Optionally, a length of the airflow divider 30 is about ⅔ of a depth of the exhaust air plenum. The circuit cards 60 can be selectively engaged in the chassis 10, 100 in a vertical orientation, wherein the airflow is from the intake air plenum 16, 106, across the vertically oriented circuit cards 60 and output through the exhaust air plenum 14, 104. Optionally, the circuit cards 60 can be selectively engaged in the chassis 10, 100 in a single height configuration. Alternatively, the circuit cards 60 can be selectively engaged in the chassis 10, 100 in a double height configuration, wherein the airflow divider 30 is a first airflow divider 30A, and the chassis 10, 100 further includes a second airflow divider 30B disposed in the exhaust air plenum 14, 104 and attached or disposed to the chassis 10, 100, wherein the first airflow divider 30A and the second airflow divider 30B are dimensioned and located in the exhaust air plenum 14, 104 to segment the exhaust air plenum 14, 104 into multiple sections causing balanced airflow from the intake air plenum 16, 106 to the output and over the circuit cards 60 disposed in the chassis 10, 100 for cooling thereof.

In an further exemplary embodiment, a method, in a chassis 10, 100 supporting a plurality of circuit cards 60 in a high-performance electronic and/or optical system includes providing the chassis 10, 100 with an exhaust air plenum 14, 104 with one or more fans 12, 102 at an output thereof, wherein the one or more fans 12, 102 are configured to cause airflow from an intake air plenum 16, 106 to the output, wherein the exhaust air plenum 14, 104 includes an airflow divider 30 disposed therein; and operating the one or more fans 12, 102, wherein the airflow divider 30 is dimensioned and located in the exhaust air plenum 14, 104 to segment the exhaust air plenum 14, 104 into multiple sections causing balanced airflow from the intake air plenum 16, 106 to the output and over the circuit cards 60 disposed in the chassis 10, 100 for cooling thereof. The method can further include selecting a location, length, and shape of the airflow divider 30 to optimize the balanced airflow.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A chassis supporting a plurality of circuit cards in a card cage of an electronic and/or optical system, the chassis comprising:
   one or more fans at an output of an exhaust air plenum, wherein the one or more fans are configured to enhance airflow in the chassis from an intake air plenum disposed across the card cage from the exhaust air plenum to the output; and
   an airflow divider configured to balance front to back distribution of airflow in the chassis, the airflow divider disposed in the exhaust air plenum and attached to or disposed in the chassis, wherein the airflow divider is dimensioned and located in the exhaust air plenum to segment the exhaust air plenum into multiple sections causing balanced airflow from the intake air plenum to the output and over the circuit cards disposed in the chassis card cage for cooling thereof, and wherein the airflow divider has a main portion, a front portion disposed at a fixed angle to the main portion, and a rear portion, the front portion being curved towards the intake air plenum substantially perpendicular to a surface of the exhaust air plenum adjacent to the card cage to separate sections thereof, the main portion being substantially horizontal, flat and parallel to a top of the exhaust air plenum and extending a portion of the depth of the exhaust air plenum, and the rear portion being disposed at a fixed downward angle towards the card cage, in the same direction as the front portion, relative to the main portion and located near the one or more fans, wherein the airflow divider is configured to turn the airflow where the airflow speed is slowest and minimize pressure drops within the chassis.

2. The chassis of claim 1, wherein the rear portion is located near the one or more fans at a downward angle.

3. The chassis of claim 1, wherein the rear portion is located near the one or more fans at a downward angle selected to optimize the airflow.

4. The chassis of claim 1, wherein the airflow divider is located in the exhaust air plenum in a manner selected to optimize the airflow at an opposite side of the one or more fans.

5. The chassis of claim 4, wherein a length of the airflow divider is about ⅔ of a depth of the exhaust air plenum.

6. The chassis of claim 1, wherein the circuit cards are selectively engaged in the chassis in a vertical orientation, wherein the airflow is from the intake air plenum, across the circuit cards and output through the exhaust air plenum.

7. The chassis of claim 6, wherein the circuit cards are selectively engaged in the chassis in a single height configuration.

8. The chassis of claim 1, wherein the circuit cards are selectively engaged in the chassis in a double height configuration, wherein the airflow divider is a first airflow divider, and the chassis further comprising:
a second airflow divider disposed in the exhaust air plenum and attached or disposed to the chassis, wherein the first airflow divider and the second airflow divider are dimensioned and located in the exhaust air plenum to segment the exhaust air plenum into multiple sections balanced airflow from the intake air plenum to the output and over the circuit cards disposed in the chassis for cooling thereof.

9. A network element in a chassis supporting a plurality of circuit cards in a card cage of an electronic and/or optical system, the network element comprising:
one or more circuit cards in the card cage of the chassis;
one or more fans at an output of an exhaust air plenum, wherein the one or more fans are configured to enhance airflow in the chassis from an intake air plenum disposed across the card cage from the exhaust air plenum to the output; and
an airflow divider configured to balance front to back distribution of airflow in the chassis, the airflow divider disposed in the exhaust air plenum and attached to or disposed in the chassis, wherein the airflow divider is dimensioned and located in the exhaust air plenum to segment the exhaust air plenum into multiple sections causing balanced airflow from the intake air plenum to the output and over the circuit cards disposed in the card cage for cooling thereof, and wherein the airflow divider has a main portion, a front portion disposed at a fixed angle to the main portion, and a rear portion, the front portion being curved towards the intake air plenum substantially perpendicular to a surface of the exhaust air plenum adjacent to the card cage to separate sections thereof, the main portion being substantially horizontal, flat and parallel to a top of the exhaust air plenum and extending a portion of the depth of the exhaust air plenum, and the rear portion being disposed at a fixed downward angle towards the card cage, in the same direction as the front portion, relative to the main portion and located near the one or more fans, wherein the airflow divider is configured to turn the airflow where the airflow speed is slowest and minimize pressure drops within the chassis.

10. The network element of claim 9, wherein the rear portion is located near the one or more fans at a downward angle.

11. The network element of claim 9, wherein the rear portion is located near the one or more fans at a downward angle selected to optimize the airflow.

12. The network element of claim 9, wherein the airflow divider is located in the exhaust air plenum in a manner selected to optimize the airflow at an opposite side of the one or more fans.

13. The network element of claim 9, wherein a length of the airflow divider is about ⅔ of a depth of the exhaust air plenum.

14. The network element of claim 9, wherein the circuit cards are selectively engaged in the chassis in a vertical orientation, wherein the airflow is from the intake air plenum, across the vertically oriented circuit cards and output through the exhaust air plenum.

15. The network element of claim 14, wherein the circuit cards are selectively engaged in the chassis in a single height configuration.

16. The network element of claim 14, wherein the circuit cards are selectively engaged in the chassis in a double height configuration, wherein the airflow divider is a first airflow divider, and the chassis further comprising:
a second airflow divider disposed in the exhaust air plenum and attached or disposed to the chassis, wherein the first airflow divider and the second airflow divider are dimensioned and located in the exhaust air plenum to segment the exhaust air plenum into multiple sections causing balanced airflow from the intake air plenum to the output and over the circuit cards disposed in the chassis for cooling thereof.

17. A method, in a chassis supporting a plurality of circuit cards in a card cage of a high-performance electronic and/or optical system, the method comprising:
providing the chassis with an exhaust air plenum with one or more fans at an output thereof, wherein the one or more fans are configured to enhance airflow in the chassis from an intake air plenum disposed across the card cage from the exhaust air plenum to the output, wherein the exhaust air plenum includes an airflow divider disposed therein that is configured to balance front to back distribution of airflow in the chassis; and
operating the one or more fans, wherein the airflow divider is dimensioned and located in the exhaust air plenum to segment the exhaust air plenum into multiple sections causing balanced airflow from the intake air plenum to the output and over the circuit cards disposed in the card cage for cooling thereof, and wherein the airflow divider has a main portion, a front portion disposed at a fixed angle to the main portion, and a rear portion, the front portion being curved towards the intake air plenum substantially perpendicular to a surface of the exhaust air plenum adjacent to the card cage to separate sections thereof, the main portion being substantially horizontal, flat and parallel to a top of the exhaust air plenum and extending a portion of the depth of the exhaust air plenum, and the rear portion being disposed at a fixed downward angle towards the card cage, in the same direction as the front portion, relative to the main portion and located near the one or more fans, wherein the the airflow divider is configured to turn the airflow where the airflow speed is slowest and minimize pressure drops within the chassis.

18. The method of claim 17, further comprising:
selecting a location, length, and shape of the airflow divider to optimize the balanced airflow.

* * * * *